United States Patent
Wu et al.

(10) Patent No.: US 8,237,235 B2
(45) Date of Patent: Aug. 7, 2012

(54) METAL-CERAMIC MULTILAYER STRUCTURE

(75) Inventors: Ting-Hau Wu, Yilan (TW); Chun-Ren Cheng, Hsin-Chu (TW); Shang-Ying Tsai, Jhongli (TW); Jung-Huei Peng, Jhubei (TW); Jiou-Kang Lee, Zhu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 261 days.

(21) Appl. No.: 12/692,118

(22) Filed: Jan. 22, 2010

(65) Prior Publication Data

US 2010/0258883 A1 Oct. 14, 2010

Related U.S. Application Data

(60) Provisional application No. 61/169,119, filed on Apr. 14, 2009.

(51) Int. Cl.
*H01L 29/84* (2006.01)
*H01L 23/495* (2006.01)

(52) U.S. Cl. ........ 257/414; 257/415; 257/700; 257/703; 257/E29.324; 257/E23.141

(58) Field of Classification Search .................. 257/414, 257/415, 703, 700, E29.324, E23.141
See application file for complete search history.

(56) References Cited

U.S. PATENT DOCUMENTS

| 4,433,004 | A | * | 2/1984 | Yonezawa et al. | 438/688 |
| 6,568,794 | B2 |   | 5/2003 | Yamanaka et al. | |
| 7,346,178 | B2 |   | 3/2008 | Zhe et al. | |
| 7,615,406 | B2 | * | 11/2009 | Higashi et al. | 438/106 |
| 7,622,782 | B2 | * | 11/2009 | Chu et al. | 257/415 |
| 7,723,144 | B2 | * | 5/2010 | Chen | 438/50 |
| 2005/0095835 | A1 | * | 5/2005 | Humpston et al. | 438/613 |
| 2006/0147746 | A1 | * | 7/2006 | Wakako et al. | 428/627 |
| 2010/0237446 | A1 | * | 9/2010 | Freidhoff | 257/415 |

FOREIGN PATENT DOCUMENTS

WO WO 90/10843 9/1990

OTHER PUBLICATIONS

Fedder, Gary, K., "MEMS Fabrication," ITC International Test Conference, IEEE, 2003, pp. 691-698.

* cited by examiner

*Primary Examiner* — Victor A Mandala
(74) *Attorney, Agent, or Firm* — Slater & Matsil, L.L.P.

(57) ABSTRACT

A metal-ceramic multilayer structure is provided. The underlying layers of the metal/ceramic multilayer structure have sloped sidewalls such that cracking of the metal-ceramic multilayer structure may be reduced or eliminated. In an embodiment, a layer immediately underlying the metal-ceramic multilayer has sidewalls sloped less than 75 degrees. Subsequent layers underlying the layer immediately underlying the metal/ceramic layer have sidewalls sloped greater than 75 degrees. In this manner, less stress is applied to the overlying metal/ceramic layer, particularly in the corners, thereby reducing the cracking of the metal-ceramic multilayer. The metal/ceramic multilayer structure includes one or more alternating layers of a metal seed layer and a ceramic layer.

27 Claims, 6 Drawing Sheets

METAL-CERAMIC MULTILAYER STRUCTURE

This application claims the benefit of U.S. Provisional Application Ser. No. 61/169,119, filed on Apr. 14, 2009, entitled "Metal-Ceramic Multilayer Structure," which application is hereby incorporated herein by reference.

TECHNICAL FIELD

The present invention relates generally to semiconductor devices and, more particularly, to micro-electro-mechanical structures.

BACKGROUND

Micro-electro-mechanical structures (MEMS) integrate electrical elements with mechanical elements on a micro scale using mircofabrication. The integration of mechanical elements with electrical elements allows for the creation of a complete system on a chip, such that the electronics of a chip may physically interact with the external environment. MEMS are often formed utilizing processes similar to those used to fabricate traditional CMOS integrated circuits, such as the formation and removal of material layers to form components of a device. The use of similar formation processes allows MEMS structures to be created using integrated circuit manufacturing facilities and equipment, allowing the creation of, for example, microphones, gyroscopes, accelerometers, and micro inkjet heads that are integrated with CMOS circuits on a single chip. Similar to integrated circuit manufacturing, MEMS are typically formed in bulk processes on a semiconductor wafer.

MEMS often utilize metal/ceramic layers to form interconnections between a MEMS device on a semiconductor wafer, other MEMS devices on the semiconductor wafer, and integrated circuits on the semiconductor wafer; metal/ceramic layers are also used for adhesion layers, strengthening layers, and buffer layers. The metal/ceramic layers are typically formed with a sputtering process after the formation of the MEMS devices. A person of ordinary skill in the art will recognize that metal/ceramic layers formed with a sputtering process will exhibit CVD-like deposition in which a layer is formed on horizontal surfaces that is thicker than the layer formed on vertical surfaces, such as the sidewall of variable topography MEMS structures. Thus, when variable topography exists on the surface of the wafer structures, the resultant metal/ceramic layers are thin along the sidewalls of changes in the surface topography.

As a result of the thin sidewall metal/ceramic layers, cracks in the metal/ceramic layers often form at changes in the surface topography, i.e., in corner regions. The cracks hinder the ability of the metal/ceramic layers to perform their intended function, often resulting in locations of high resistance and a lack of structural support. Therefore, there is a need for a system and/or method for forming the metal/ceramic layers.

SUMMARY OF THE INVENTION

These and other problems are generally solved or circumvented, and technical advantages are generally achieved, by embodiments of the present invention which provide a strengthened semiconductor wafer and a method for forming the same.

In accordance with an illustrated embodiment of the present invention, a semiconductor device is provided. The semiconductor device includes a substrate, a first layer formed over the substrate, the first layer having a sidewall slope of 75 degrees or less, and one or more metal/ceramic layers formed over the first layer.

In accordance with another embodiment of the present invention, a semiconductor device is provided. The semiconductor device comprises a substrate and one or more layers formed over the substrate, the one or more layers having a sidewall slope of greater than 75 degrees. The semiconductor device further comprises a first layer formed over the one or more layers, the first layer having a sidewall slope of 75 degrees or less, and one or more metal/ceramic layers formed over the first layer.

In accordance with yet another embodiment of the present invention, a MEMS device is provided. The MEMS device comprises a substrate, and one or more layers formed over the substrate, the one or more layers having sloped sidewalls. The MEMS device further comprises a first layer formed over the one or more layers, the first layer having sloped sidewalls, the sloped sidewalls of the one or more layers having a greater slope than the sloped sidewalls of the first layer, and one or more metal/ceramic layers formed over the first layer and the one or more layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently illustrated embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-11 are cross-sectional views of intermediate stages in the making of an embodiment of the present invention. The embodiment shown illustrates one instance of the use of metal/ceramic layers disclosed by the present invention. Other embodiments within the scope of the present invention may include any structure in which metal/ceramic layers are used, such as micro-electro-mechanical (MEMS) devices. MEMS devices may include, for example, micro inkjet heads, gyroscopes, accelerometers, microphones, or the like.

Figure 1:
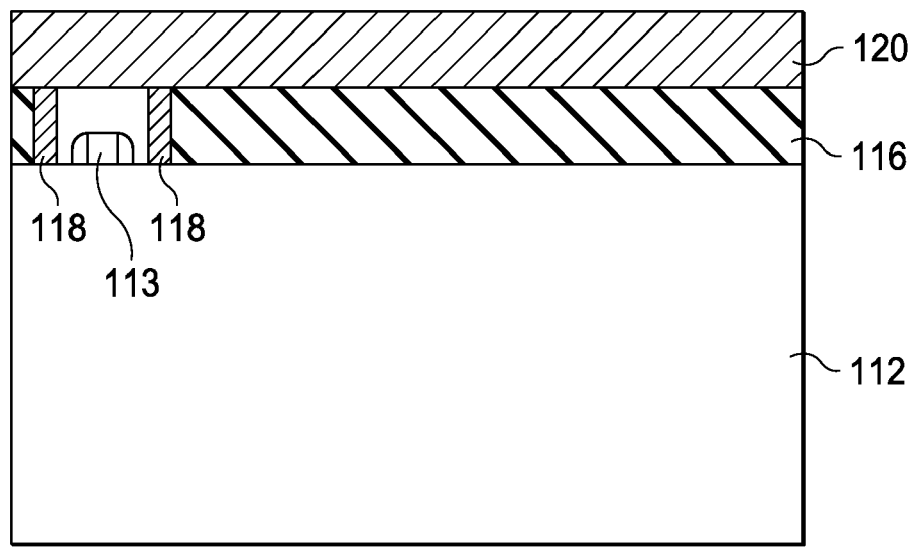
FIGS. 1-11 illustrate intermediate stages in the process for forming crack-less metal/ceramic layers on variable topography MEMS.

Referring first to FIG. 1, a first substrate 112 is shown having electrical circuitry 113 formed thereon. The first substrate 112 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrates may also be used.

The electrical circuitry 113 formed on the first substrate 112 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 113 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is an inter-layer dielectric (ILD) layer 116. The ILD layer 116 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, chemical vapor deposition (CVD), and plasma-enhanced CVD (PECVD). It should also be noted that the ILD layer 116 may comprise a plurality of dielectric layers, with or without an etch stop layer (not shown) formed between adjacent dielectric layers.

Contacts 118 are formed through the ILD layer 116 to provide an electrical contact to the electrical circuitry 113. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. In the illustrated embodiment, the openings are lined with a diffusion barrier layer and/or an adhesion layer (not shown), and filled with a conductive material. The diffusion barrier layer may comprise one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry 113 to each other and to provide an external electrical connection. The IMD layers 120 may be formed of a low-K dielectric material, such as fluorosilicate glass (FSG) formed by PECVD techniques or high-density plasma CVD (HDPCVD) or the like, and may include intermediate etch stop layers (not shown).

Figure 2:
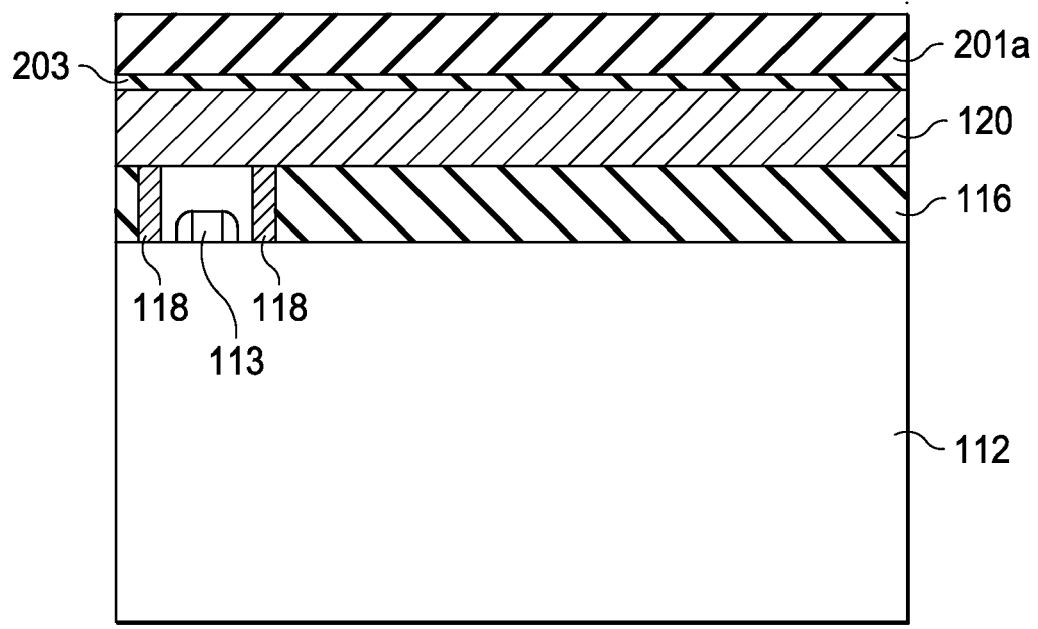

Referring now to FIG. 2, a passivation layer 203 is formed over the top metallization layer. The passivation layer 203 insulates the top metallization layer from undesired contacts with structures formed above the top metallization layer and can comprise silicon dioxide, silicon nitride, or the like, formed with any suitable process, such as CVD, PECVD, or the like. A first MEMS layer 201a is formed over the passivation layer 203. It should be noted that the first MEMS layer 201a represents a layer upon which a ceramic layer may be formed in subsequent processing, and as such, may comprise a layer of, for example, a MEMS device, such as a MEMS microphone, a MEMS accelerometer or gyroscope, a MEMS inkjet head, or the like.

Figure 3:
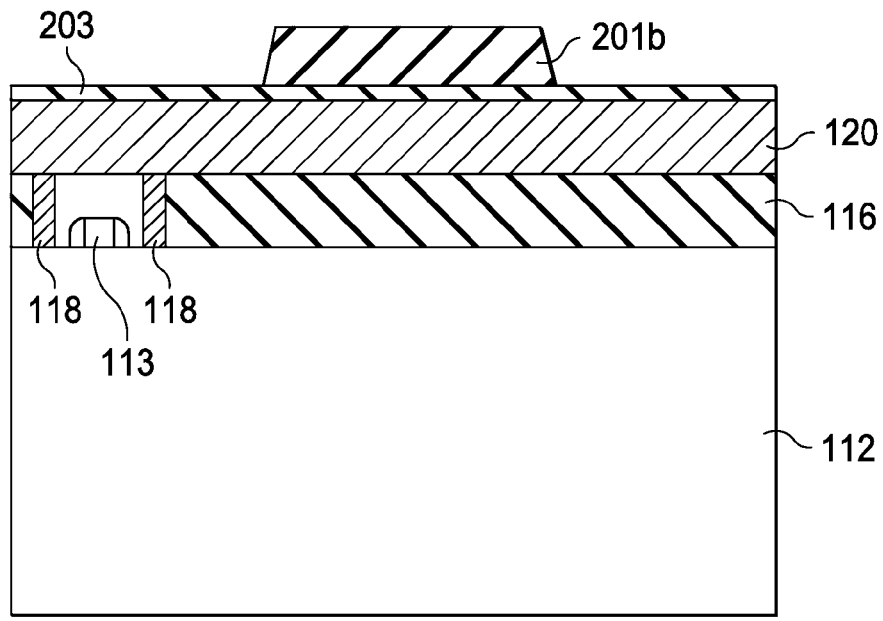
Figure 4:
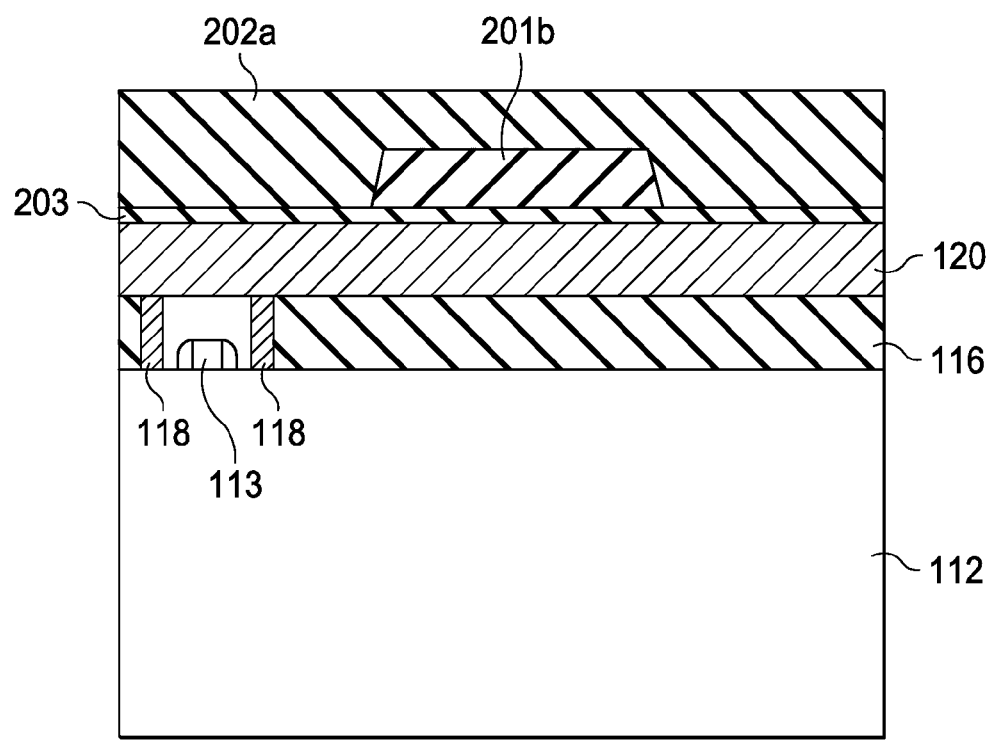

Referring now to FIG. 3, excess portions of the of the first MEMS layer 201a are removed. In an embodiment in which the first MEMS layer 201a comprises a silicon-based material, such as SiN, SiO, or the like, an anisotropic dry etching process may be used, thereby resulting in the first MEMS structure 201b. Thereafter, a second MEMS layer 202a is formed over the first MEMS structure 201b, as illustrated in FIG. 4. It should be noted that the second MEMS layer 202a represents a layer upon which a ceramic layer may be formed in subsequent processing, and as such, may comprise a layer of, for example, a MEMS device, such as a MEMS microphone, a MEMS accelerometer or gyroscope, a MEMS inkjet head, or the like.

Figure 5:
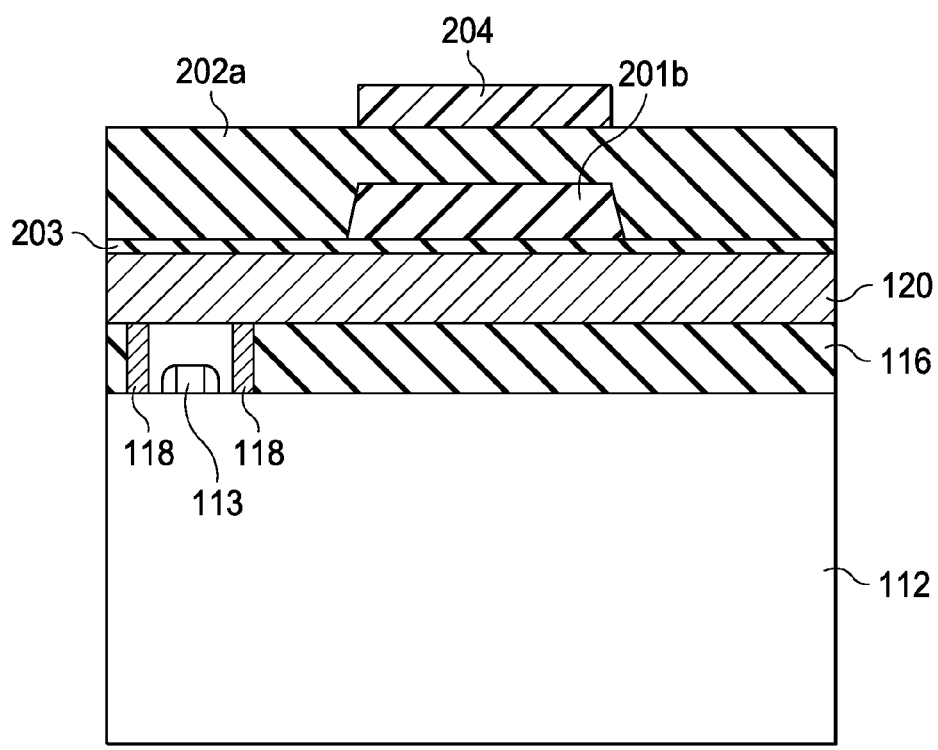
Figure 6:
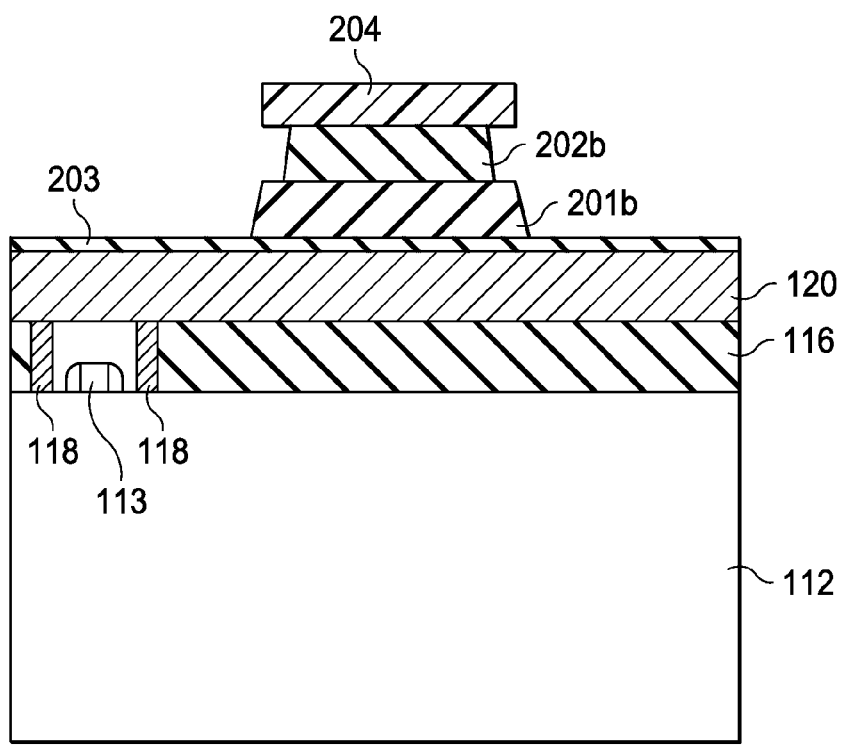
Figure 7:
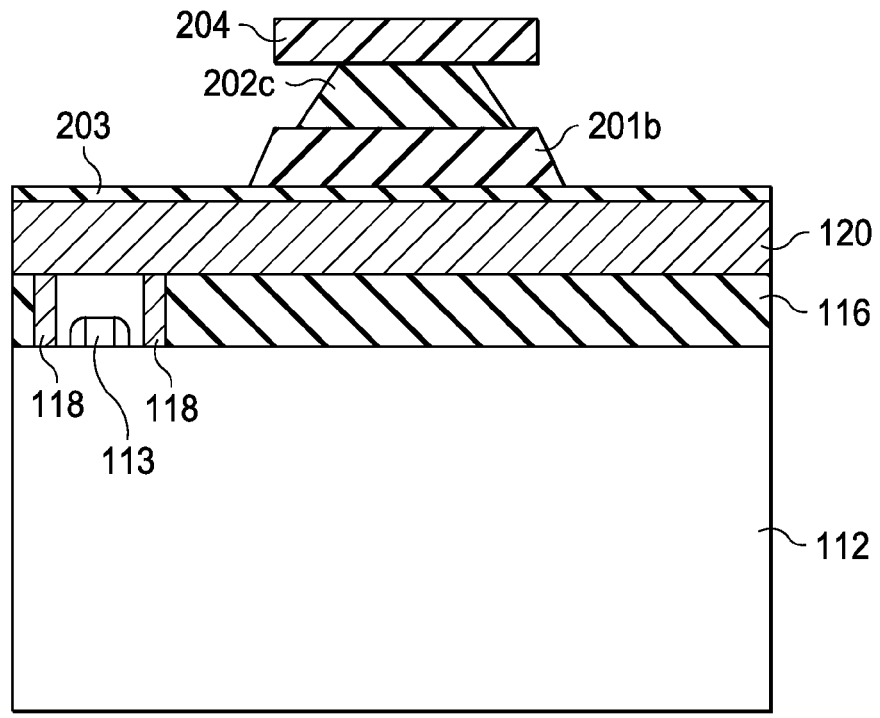

A patterned photoresist layer 204 is then formed over the second MEMS layer 202a, as illustrated in FIG. 5. The photoresist layer 204 is exposed through a photomask allowing light to impinge on the photoresist, and the photoresist is developed to form the pattern of the photoresist layer 204 shown in FIG. 5. In an embodiment in which the second MEMS layer 202a comprises a silicon-based material, such as SiN, SiO, or the like, an anisotropic dry etching process may be used to remove excess portions of the second MEMS layer 202a, thereby resulting in the second MEMS structure 202b having sidewalls as illustrated in FIG. 6. Where the second MEMS layer 202a comprises the uppermost layer of a MEMS device, the anisotropic dry etching process is followed by a timed dry isotropic etching process, performed in a biasless environment. The isotropic etching process removes portions of the second MEMS structure 202b along the sidewalls of the second MEMS structure 202b thus forming the sloped sidewalls of a second MEMS structure 202c shown in FIG. 7.

Figure 8:
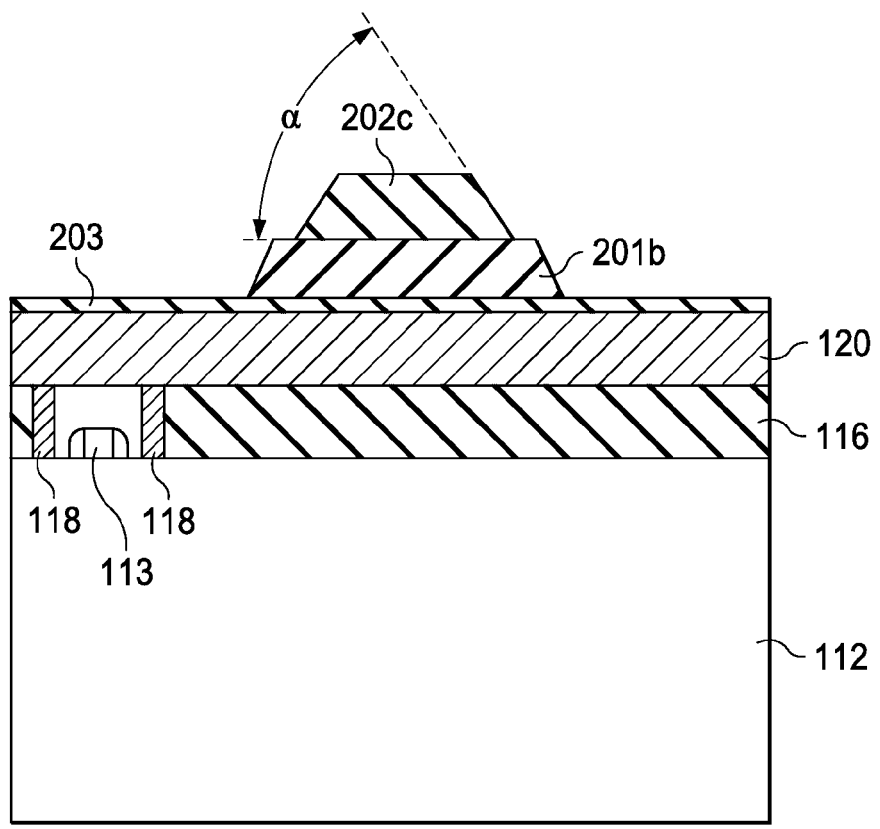

Thereafter, the photoresist 204 is removed and, as illustrated in FIG. 8, the two stage etch process (an anisotropic dry etch followed by an isotropic dry etch) used to pattern the second MEMS layer 202a results in the tapered sidewalls of the second MEMS structure 202c such that angle α is less than 75°, and in the illustrated embodiment, between about 70° and about 73°. It has been found that tapering the sidewalls of the uppermost layer to have an angle less than 75° reduces the stress of the subsequently formed metal/ceramic layer in the corners, particularly in the corner regions where the second MEMS structure 202c meets the first MEMS structure 201b and where the first MEMS structure 201b meets the passivation layer 203. Furthermore, it has been found that a sidewall slope between about 70° and about 73° on the uppermost layer provides significant advantages in formation of the metal/ceramic layers without requiring additional space. As illustrated in FIG. 8, tapered sidewalls of the first MEMS structure 201b may be greater than the tapered sidewalls of the second MEMS structure 202c, including, e.g., less than or greater than about 75°.

Furthermore, it should be noted that two layers are shown for illustrative purposes only and that embodiments of the present invention may also encompass a MEMS device, or a portion of a MEMS device, having a single layer, or three or more layers. In another embodiment, three or more layers may be formed. In this alternative embodiment, the uppermost layer has tapered sidewalls. For example, if a third MEMS structure were to be formed over the second MEMS structure 202b, then the third MEMS structure would have an angle of approximately α. In embodiments having a single layer, the single layer has tapered sidewalls with an angle of approximately α formed according to the two stage etch process described above with respect to second MEMS structure 202c.

It should also be noted that the method illustrated in the Figures assumes that the first MEMS layer 201a may be formed and patterned to form the first MEMS structure 201b, and then the second MEMS layer 202a may be formed and patterned to form the second MEMS structure 202c. In another embodiment, however, the first MEMS layer 201a and the second MEMS layer 202a are both formed and then both are patterned to form the first MEMS structure 201b and the second MEMS structure 202b. An isotropic dry etching process is then used on the second MEMS structure 202b to form the second MEMS structure 202c having sloped sidewalls.

Figure 9:
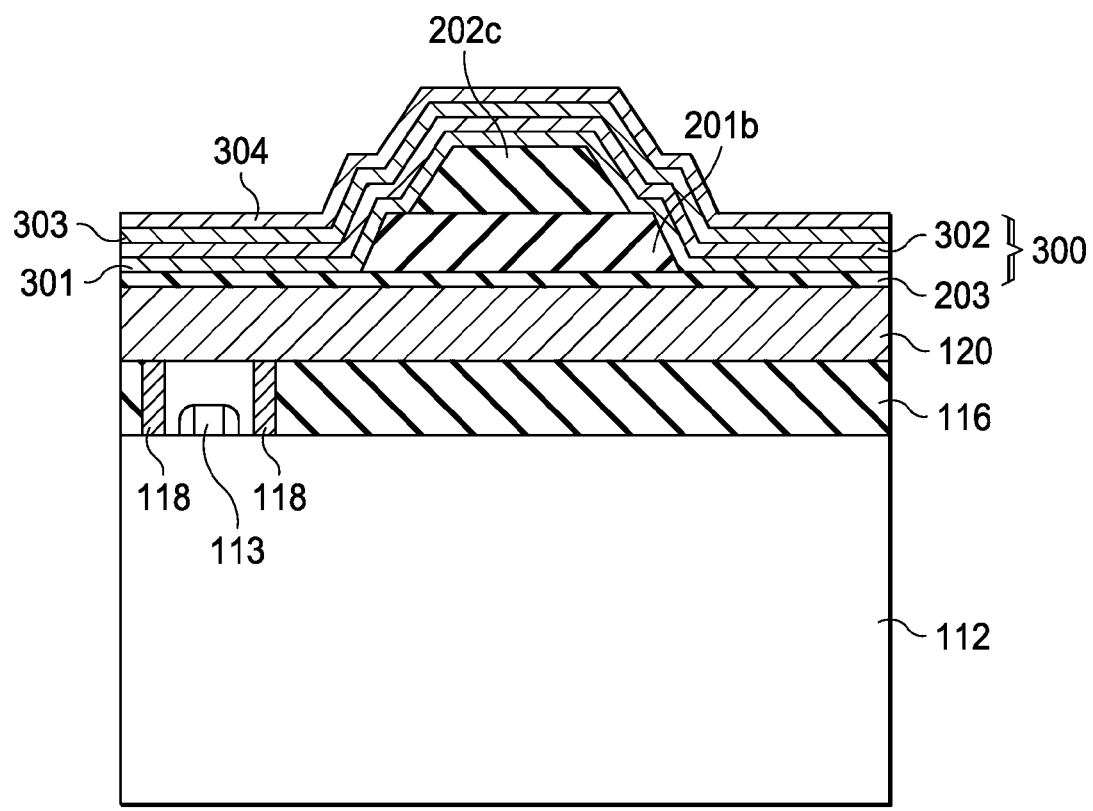

Referring now to FIG. 9, a metal/ceramic multilayer 300 is shown in accordance with an embodiment of the present invention. A person of ordinary skill in the art will note that the sloped sidewalls of the second MEMS structure 202c allow for relatively uniform formation of the metal/ceramic multilayer 300, such that the thickness of the metal/ceramic multilayer 300 on horizontal surfaces is approximately equal to the thickness of the metal/ceramic multilayer 300 on vertical surfaces. In the embodiment illustrated in FIG. 9, the metal/ceramic multilayer 300 comprises a first metal seed layer 301, a first ceramic layer 302, a second metal seed layer 303, and a second ceramic layer 304.

The first metal seed layer 301 is formed over the passivation layer 203, the first MEMS structure 201b, and the second MEMS structure 202c. In the illustrated embodiment, the first metal seed layer may be TiAl, AlCu, TaAl, Al, or the like, formed by a sputtering process. Thereafter, the first ceramic layer 302 is formed over the first metal seed layer 301. The first ceramic layer 302 is may be a TiAlN layer, or the like, formed using a sputtering process, although other materials, such as AlCuN, TaAlN, AlO, and processes are contemplated. The second metal seed layer 303 is formed over the first ceramic layer 302, and the second ceramic layer 304 is formed over the second metal seed layer 303. The second metal seed layer 303 and the second ceramic layer 304 may be formed using similar materials and processes as those used to form the first metal seed layer 301 and the first ceramic layer 302, respectively.

It should be noted that the metal/ceramic multilayer 300 shown in FIG. 9 includes two layers of metal and ceramic materials for illustrative purposes only, and that the number of layers in the metal/ceramic multilayer 300 may incorporate only one layer, or three or more layers. A person of ordinary skill in the art will recognize that the metal/ceramic layers may interconnect the various components formed on the semiconductor wafer or form an upper element of a MEMS device, while also providing structural support to the underlying semiconductor/MEMS device.

Figure 10:
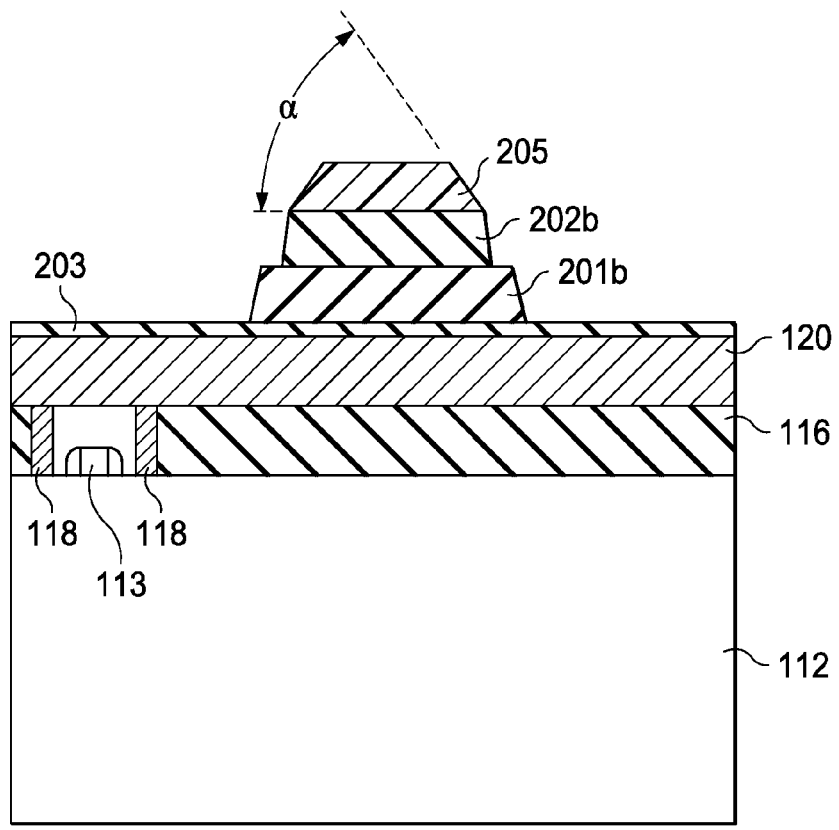

In an alternative embodiment, illustrated in FIG. 10, a first MEMS layer 201a and a second MEMS layer 202a may be formed and excess portions of the first MEMS layer 201a and the second MEMS layer 202a may be removed by an anisotropic dry etching process, creating a first MEMS structure 201b and a second MEMS structure 202b. A patterned photoresist layer 205 is formed over the second MEMS structure 202b. The photoresist layer 205 is exposed through a photomask in which a focus-energy matrix of a photoresist profile is adjusted to allow light to impinge on the photoresist layer 205 such that the patterned photoresist layer 205 has tapered sidewalls of approximately angle α after the photoresist layer 205 has been developed. The angle α is less than 75°, and in the illustrated embodiment, between about 70° and about 73°. Furthermore, it has been found that a slope between about 70° and about 73° provides significant advantages in formation of the metal/ceramic layers without requiring additional space.

Figure 11:
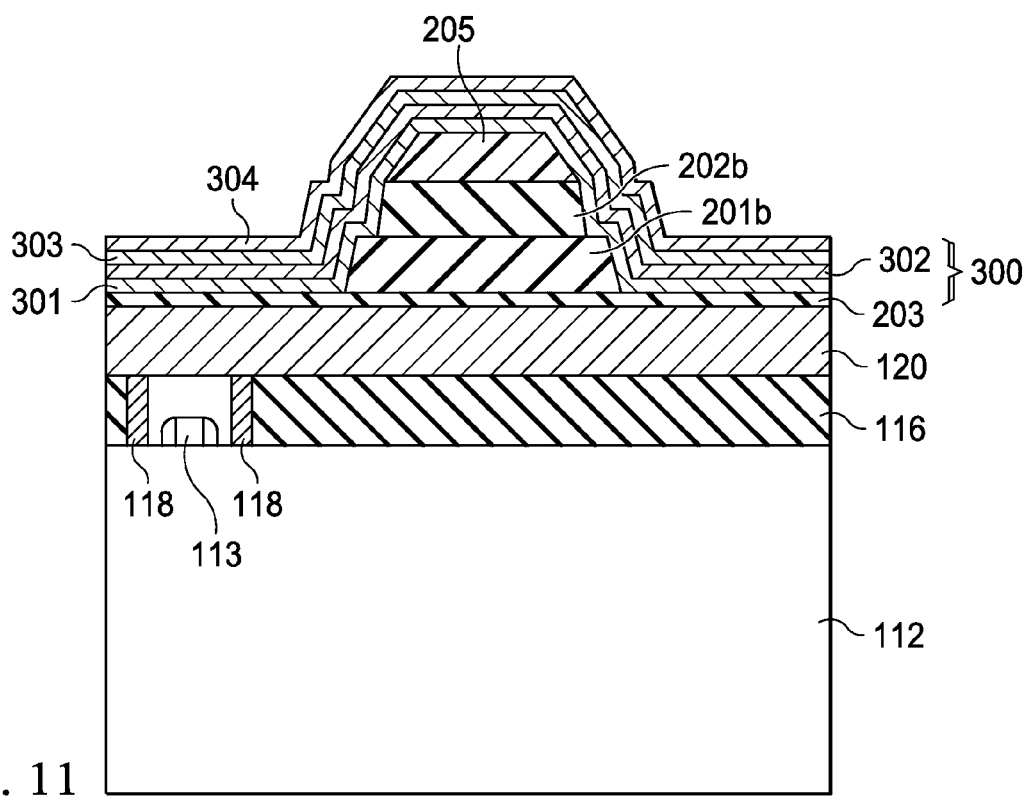

Referring now to FIG. 11, a metal/ceramic multilayer 300 is shown in accordance with an embodiment of the present invention. A person of ordinary skill in the art will note that the sloped sidewalls of the photoresist layer 205 allow for relatively uniform formation of the metal/ceramic multilayer 300, such that the thickness of the metal/ceramic multilayer 300 on horizontal surfaces is approximately equal to the thickness of the metal/ceramic multilayer 300 on vertical surfaces. In the embodiment illustrated in FIG. 11, the metal/ceramic multilayer 300 comprises a first metal seed layer 301, a first ceramic layer 302, a second metal seed layer 303, and a second ceramic layer 304.

The first metal seed layer 301 is formed over the passivation layer 203, the first MEMS structure 201b, the second MEMS structure 202c, and the photoresist layer 205. In the illustrated embodiment, the first metal seed layer may be TiAl, AlCu, TaAl, Al, or the like, formed by a sputtering process. Thereafter, the first ceramic layer 302 is formed over the first metal seed layer 301. The first ceramic layer 302 is may be a TiAlN layer, or the like, formed using a sputtering process, although other materials, such as AlCuN, TaAlN, AlO, and processes are contemplated. The second metal seed layer 303 is formed over the first ceramic layer 302, and the second ceramic layer 304 is formed over the second metal seed layer 303. The second metal seed layer 303 and the second ceramic layer 304 may be formed using similar materials and processes as those used to form the first metal seed layer 301 and the first ceramic layer 302, respectively.

It should be noted that the metal/ceramic multilayer 300 shown in FIG. 11 includes two layers of metal and ceramic materials for illustrative purposes only, and that the number of layers in the metal/ceramic multilayer 300 may incorporate only one layer, or three or more layers. In an embodiment, the photoresist layer 205 comprises a sacrificial layer used to provide structural support during the formation of the metal/ceramic layers and in further processing of the wafer on which the MEMS device resides. The photoresist layer 205 may be removed in later processing freeing the metal/ceramic layer for operation as a part of the MEMS device. A person of ordinary skill in the art will recognize that the metal/ceramic layers may also interconnect the various components formed on the semiconductor wafer and provide structural support to the underlying semiconductor/MEMS device.

One of ordinary skill in the art will appreciate that the slope of the sidewall is such that cracks in the metal/ceramic layers at topographical changes in the MEMS device are reduced or eliminated. Thus, the metal/ceramic layers deposited on the sloped sidewall of the MEMS structure comprise a component of the MEMS device while also providing additional strength to the underlying semiconductor device and interconnecting the elements with less resistance.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a substrate;
a first layer over the substrate, the first layer having a first sidewall and a second sidewall, each of the first sidewall and the second sidewall having a slope of 75 degrees or less; and
one or more metal/ceramic layers formed over the first layer, the one or more metal/ceramic layers extending from the first sidewall to the second sidewall.

2. The semiconductor device of claim 1, further comprising one or more layers interposed between the first layer and the substrate, the one or more layers having a sidewall slope of greater than the slope of the first sidewall and the second sidewall.

3. The semiconductor device of claim 2, wherein the sidewall slope of the one or more layers is less than 75 degrees.

4. The semiconductor device of claim 1, wherein at least a portion of the one or more metal/ceramic layers comprises at least a part of a MEMS device.

5. The semiconductor device of claim 1, wherein the slope of the first sidewall and the second sidewall is between about 70 degrees and about 73 degrees.

6. The semiconductor device of claim 1, wherein the one or more metal/ceramic layers over the first layer comprises:
one or more metal seed layers; and
one or more ceramic layers.

7. The semiconductor device of claim 6, wherein the one or more metal seed layers are formed of TiAl, AlCu, TaAl, Al, or combinations thereof.

8. The semiconductor device of claim 6, wherein the one or more ceramic layers are formed of TiAlN, AlCuN, TaAlN, AlO, or combinations thereof.

9. A semiconductor device comprising:
a substrate;
one or more layers over the substrate;
a first layer over the one or more layers, the first layer having a sidewall slope of 75 degrees or less, the one or more layers having a sidewall slope greater or equal to the sidewall slope of the first layer; and
one or more metal/ceramic layers completely covering an upper surface of the first layer.

10. The semiconductor device of claim 9, wherein the sidewall slope of the one or more layers is less than 75 degrees.

11. The semiconductor device of claim 9, wherein the sidewall slope of the first layer is between about 70 degrees and about 73 degrees.

12. The semiconductor device of claim 9, wherein the first layer comprises a photoresist layer.

13. The semiconductor device of claim 9, wherein at least a portion of the one or more layers and the one or more metal/ceramic layers form at least a portion of a MEMS device.

14. The semiconductor device of claim 9, wherein at least a portion of the first layer, the one or more layers, and the one or more metal/ceramic layers form at least a portion of a MEMS device.

15. A MEMS device comprising:
a substrate;
one or more layers over the substrate, the one or more layers having sloped sidewalls;
a first layer over the one or more layers, the first layer having sloped sidewalls, the sloped sidewalls of the one or more layers having a greater slope than the sloped sidewalls of the first layer; and
one or more metal/ceramic layers over the first layer and the one or more layers.

16. The MEMS device of claim 15, wherein the first layer comprises a photoresist layer.

17. The MEMS device of claim 15, wherein:
the first layer has sloped sidewalls between about 70 degrees and about 73 degrees; and
the one or more layers has sloped sidewalls less than 75 degrees.

18. The MEMS device of claim 15, wherein the one or more metal/ceramic layers over the first layer comprises:
one or more metal seed layers; and
one or more ceramic layers.

19. The MEMS device of claim 18, wherein the one or more metal seed layers are formed of TiAl, AlCu, TaAl, Al, or combinations thereof.

20. The MEMS device of claim 18, wherein the one or more ceramic layers are formed of TiAlN, AlCuN, TaAlN, AlO, or combinations thereof.

21. A semiconductor device comprising:
a substrate;
a first layer over the substrate, the first layer having a sidewall slope of 75 degrees or less; and
one or more metal/ceramic layers formed over the first layer, wherein at least a portion of the one or more metal/ceramic layers comprises at least a part of a MEMS device.

22. The semiconductor device of claim 21, further comprising one or more layers interposed between the first layer and the substrate, the one or more layers having a sidewall slope of greater than 75 degrees.

23. The semiconductor device of claim 21, further comprising one or more layers interposed between the first layer and the substrate, the one or more layers having a sidewall slope greater than the sidewall slope of the first layer.

24. The semiconductor device of claim 21, wherein the sidewall slope is between about 70 degrees and about 73 degrees.

25. The semiconductor device of claim 21, wherein the one or more metal/ceramic layers over the first layer comprises:
one or more metal seed layers; and
one or more ceramic layers.

26. The semiconductor device of claim 25, wherein the one or more metal seed layers are formed of TiAl, AlCu, TaAl, Al, or combinations thereof.

27. The semiconductor device of claim 25, wherein the one or more ceramic layers are formed of TiAlN, AlCuN, TaAlN, AlO, or combinations thereof.

* * * * *